United States Patent
Huang et al.

(10) Patent No.: US 12,363,852 B1
(45) Date of Patent: Jul. 15, 2025

(54) TOOL-FREE UNLOCKING DEVICE

(71) Applicant: Nan Juen International Co., Ltd., Taoyuan (TW)

(72) Inventors: Kuo-Chih Huang, Taoyuan (TW); Yi-Tian Li, Taoyuan (TW)

(73) Assignee: Nan Juen International Co., Ltd., Taoyuan (TW)

( * ) Notice: Subject to any disclaimer, the term of this patent is extended or adjusted under 35 U.S.C. 154(b) by 0 days.

(21) Appl. No.: 18/415,583

(22) Filed: Jan. 17, 2024

(51) Int. Cl.
*H05K 7/14* (2006.01)
*A47B 88/43* (2017.01)

(52) U.S. Cl.
CPC .......... *H05K 7/1489* (2013.01); *A47B 88/43* (2017.01); *H05K 7/1401* (2013.01)

(58) Field of Classification Search
CPC ...... A47B 88/40; A47B 88/43; H05K 7/1489; H05K 7/1401
See application file for complete search history.

(56) References Cited

U.S. PATENT DOCUMENTS

| | | | |
|---|---|---|---|
| 6,976,745 B2 * | 12/2005 | Dobler | A47B 88/407 312/334.44 |
| 7,144,184 B1 * | 12/2006 | Tsai | F16B 12/32 403/167 |
| 7,703,734 B2 * | 4/2010 | Chen | A47B 88/43 312/351 |
| 7,798,581 B2 * | 9/2010 | Chen | G06F 1/183 312/334.4 |
| 8,562,086 B1 * | 10/2013 | Baik | A47B 88/931 312/334.4 |
| 8,662,607 B2 * | 3/2014 | Fan | H05K 7/1489 312/334.47 |
| 8,939,474 B2 * | 1/2015 | Hagemeyer | E05B 63/14 292/137 |
| 8,967,565 B2 * | 3/2015 | Chen | H05K 7/1489 248/221.11 |
| 9,681,574 B1 * | 6/2017 | Chen | H05K 7/1489 |
| 9,743,550 B2 * | 8/2017 | Byargeon | F16B 2/18 |
| 2003/0052580 A1 * | 3/2003 | Dobler | A47B 88/43 312/334.44 |
| 2009/0309471 A1 * | 12/2009 | Yu | A47B 88/43 312/334.44 |
| 2011/0192946 A1 * | 8/2011 | Yu | A47B 88/43 248/298.1 |

* cited by examiner

*Primary Examiner* — Ko H Chan

(57) ABSTRACT

A tool-free unlocking device includes a frame with an opening; an unlatching member movably connected to the frame; and a locking member having a first section fixed on the frame and a second section extending from first section and corresponding to the opening. Thus, when the unlatching member is not pushed, the end surface of the second section of the locking member abuts to form a locked state, or when the unlatching member is pushed from the first section of the locking member to the second section of the locking member, the second section of the locking member will be pushed down to the opening of the frame to form an unlocked state.

20 Claims, 13 Drawing Sheets

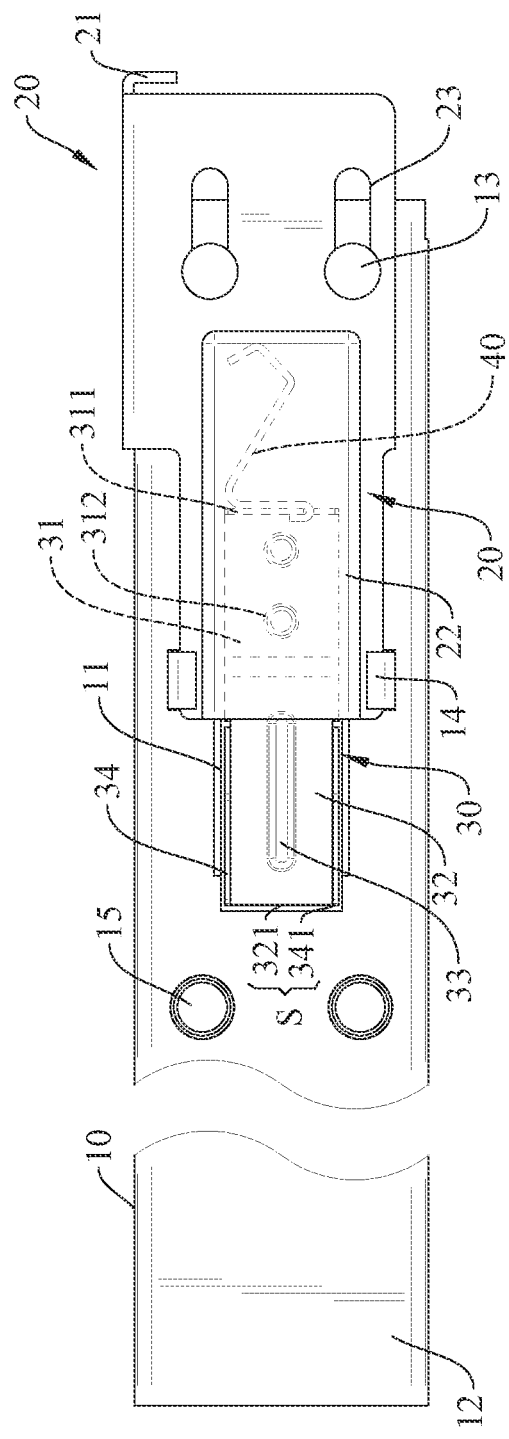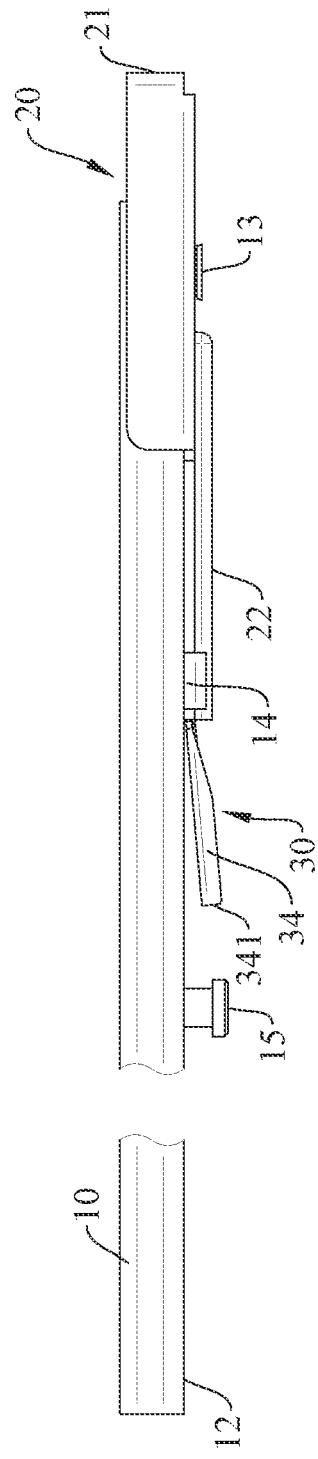
FIG. 3
FIG. 4

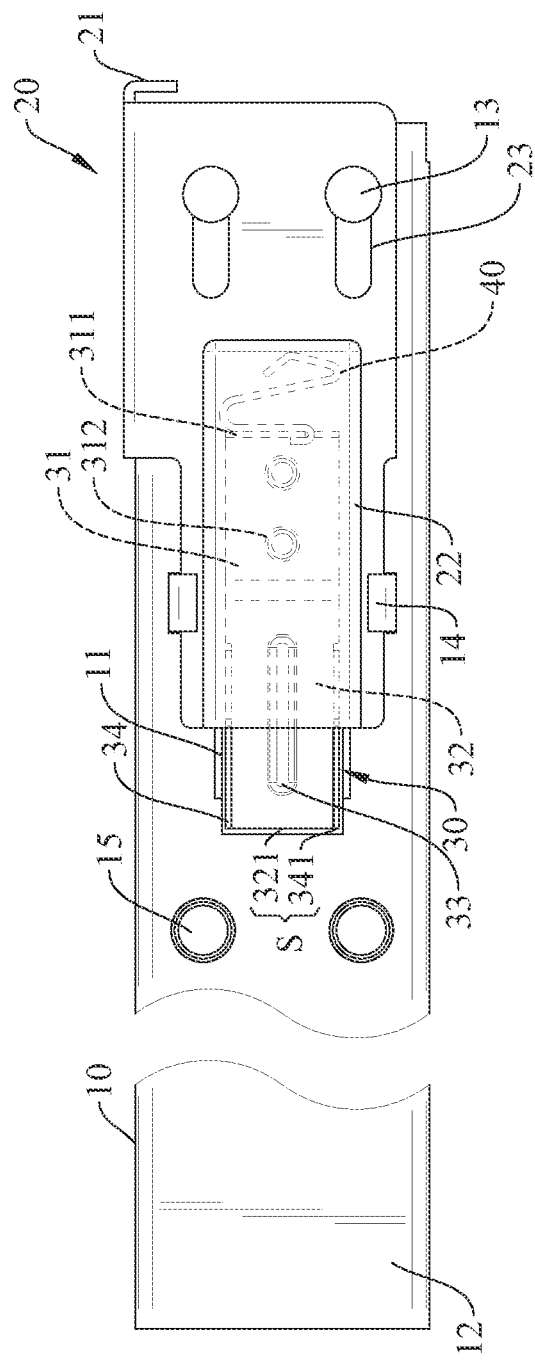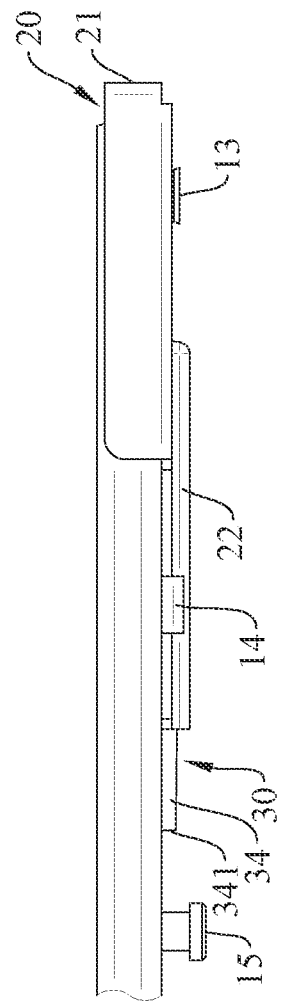
FIG. 5
FIG. 6

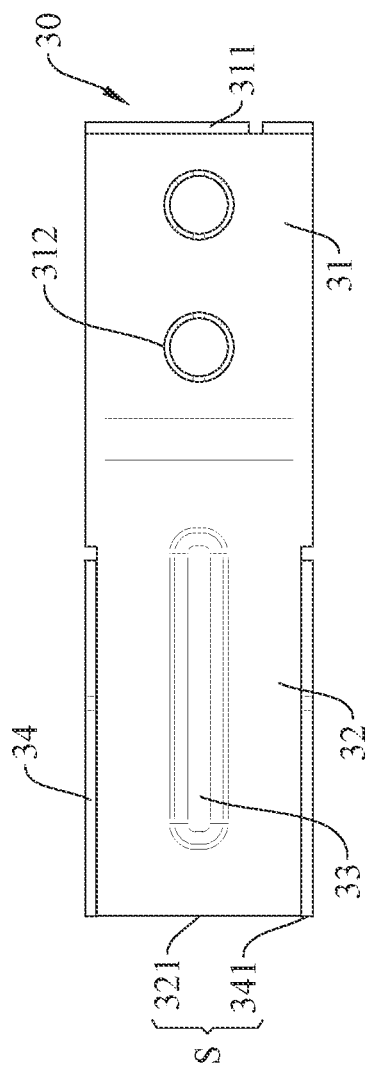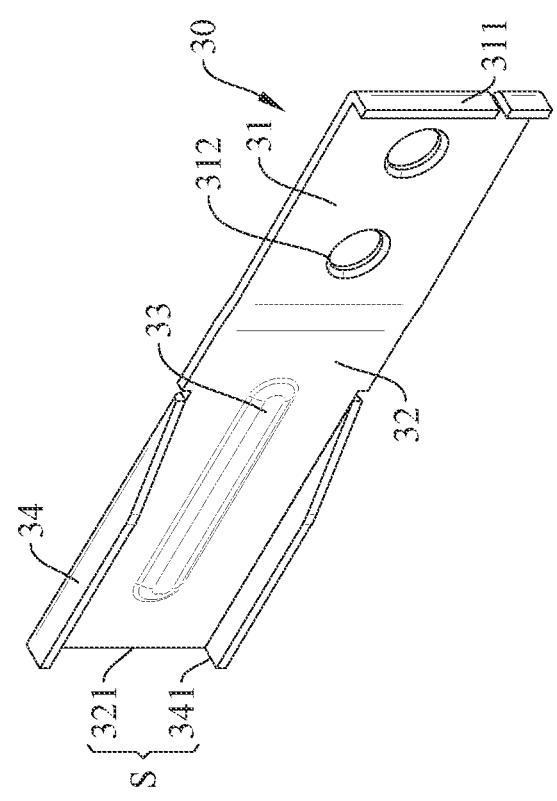
FIG. 7A
FIG. 7B

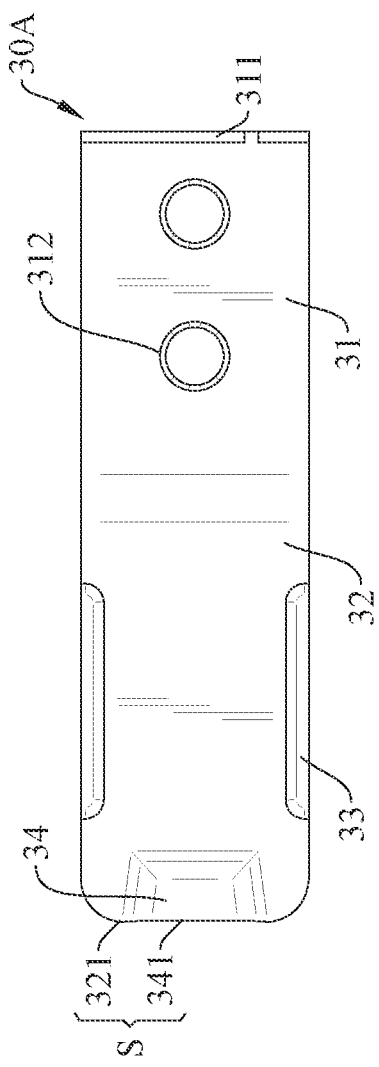
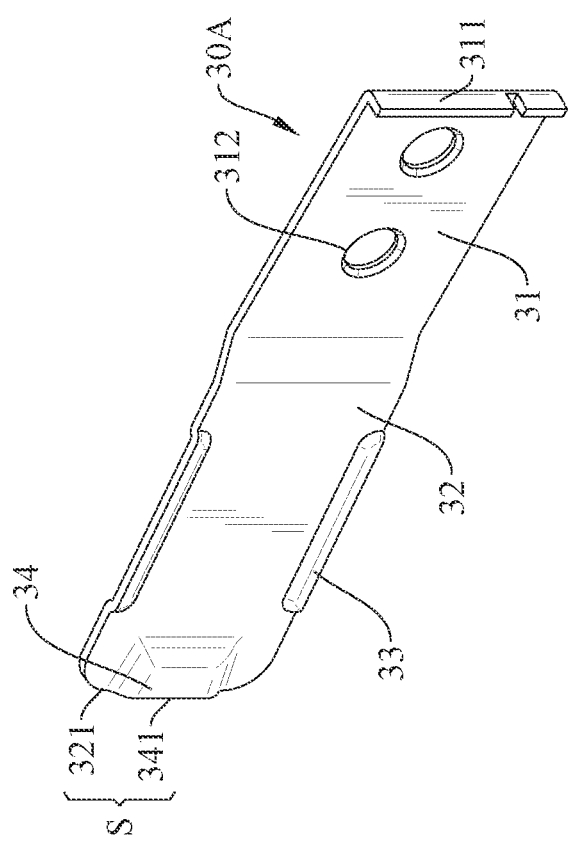
FIG. 8A
FIG. 8B

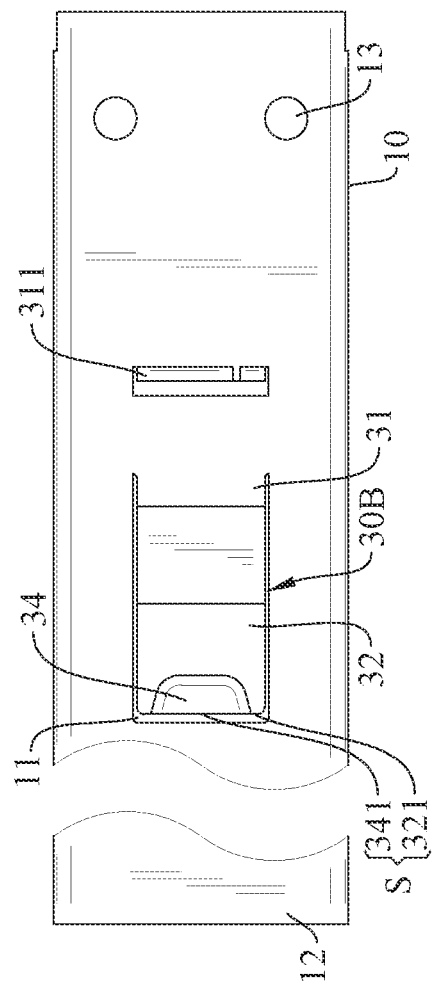
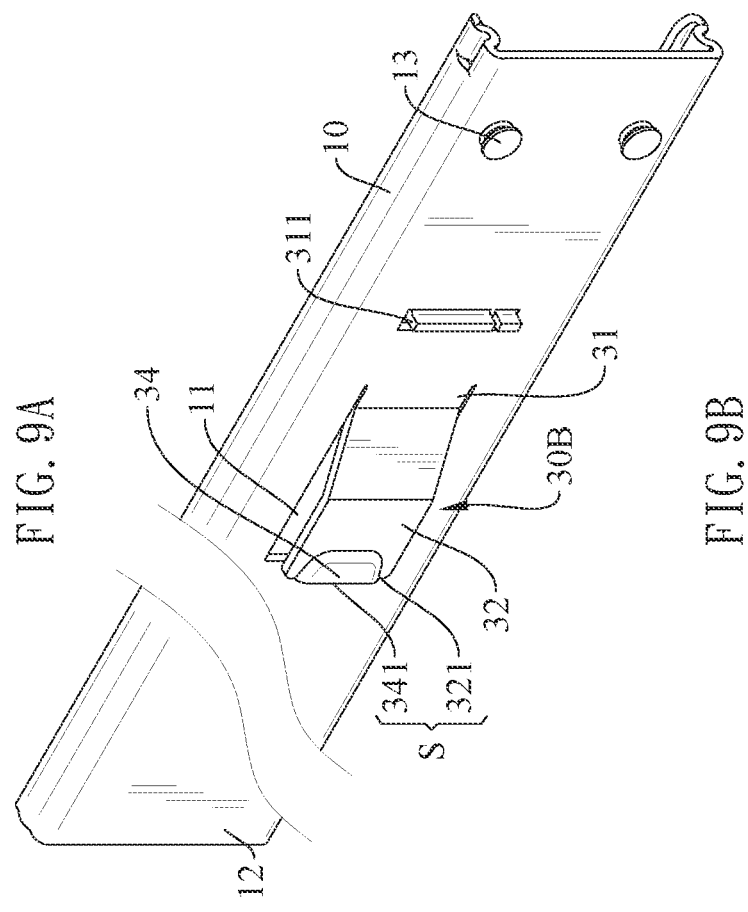
FIG. 9A
FIG. 9B

TOOL-FREE UNLOCKING DEVICE

BACKGROUND OF THE INVENTION

1. Field of the Invention

The present invention relates to a tool-free unlocking device, especially applied to server slide rails. Its function is to quickly locate and disassemble the slide rails.

2. Description of the Related Art

The server slide rail is installed between the server chassis and the cabinet, and a fastener at the front end of the server slide rail is positioned in the machine column hole of the cabinet to prevent the server chassis from sliding out of the cabinet. The fastener needs to be fixed on the slide rail with screws and nuts, but this fixing method requires the use of tools when loading and disassembling on the slide rail, and the procedure is time-consuming. For this reason, how to solve the problems and deficiencies of the above-mentioned existing technologies is an issue that relevant industries are eager to research and develop.

SUMMARY OF THE INVENTION

The main object of the present invention is to provide a tool-free unlocking device, which improves the efficiency of the operator to quickly position the servo slide rail without using tools.

Another object of the present invention is to provide a tool-free unlocking device that can cooperate with the machine column to quickly position the servo slide rail to improve the efficiency.

In order to achieve the above object, the technical means adopted by the present invention include: a frame with an opening; an unlatching member movably connected to the frame; and a locking member having a first section fixed on the frame and a second section extending from first section and corresponding to the opening. Thus, when the unlatching member is not pushed, the end surface of the second section of the locking member abuts to form a locked state, or when the unlatching member is pushed from the first section of the locking member to the second section of the locking member, the second section of the locking member will be pushed down to the opening of the frame to form an unlocked state.

According to the previously disclosed characteristics, it also includes an elastic member. One end of the elastic member is connected to the locking member, and the other end of the elastic member is driven by the unlatching member to operate.

According to the previously revealed characteristics, the elastic member is strip-shaped.

According to the previously revealed characteristics, the unlatching member further comprises a pushing portion and a pushing groove. The pushing portion can span said frame and the pushing groove corresponds to the surface of the frame, so that the elastic member can be accommodated in the pushing groove, and when the pushing portion is pushed, the pushing groove can displace the elastic member.

According to the previously revealed characteristics, the frame is provided with at least one limiting member, and the unlatching member is provided with at least one limiting hole. The at least one limiting hole can be displaced relative to the at least one limiting member.

According to the previously revealed characteristics, there is at least one limiter on the frame, and the limiter can be hooked into the unlatching member.

According to the previously revealed characteristics, the second section of the locking member has at least one first rib, and the first rib is located in front of the end surface of the second section.

According to the previously revealed characteristics, the second section of the locking member is provided with at least one second rib, and the end surface of the at least one second rib and the end surface of the second section form an abutment surface.

According to the previously revealed characteristics, the first section of the locking member and the frame are integrated.

According to the previously revealed characteristics, the tool-free unlocking device further comprises a machine column. The machine column comprises at least one positioning hole and at least one disassembly hole respectively connected to the at least one positioning hole. Furthermore, the frame is provided with at least one positioning member, and the at least one positioning member can move to the at least one positioning hole to position the frame, or move to the at least one disassembly hole to disassemble the frame.

With the help of the above-mentioned technology, the tool-free unlocking device not only allows the operator to quickly position the server slide rail without using tools, but also can cooperate with the machine column to quickly position the server slide rail, which have complementary and multiplicative effects.

BRIEF DESCRIPTION OF THE DRAWINGS

FIG. 3 is a view of the unlatching member of the present invention before it is pushed.

FIG. 4 is a top view of the unlatching member of the present invention without being pushed.

FIG. 5 is a front view of the unlatching member of the present invention when it is pushed.

FIG. 6 is a top view of the unlatching member being pushed according to the present invention.

FIG. 7A is a front view of the first embodiment of the locking member of the present invention.

FIG. 7B is a perspective view of the first embodiment of the locking member of the present invention.

FIG. 8A is a front view of the second embodiment of the locking member of the present invention.

FIG. 8B is a perspective view of the second embodiment of the locking member of the present invention.

FIG. 9A is a front view of the third embodiment of the locking member of the present invention.

FIG. 9B is a perspective view of the third embodiment of the locking member of the present invention.

DETAILED DESCRIPTION OF THE PREFERRED EMBODIMENT

Figure 1:
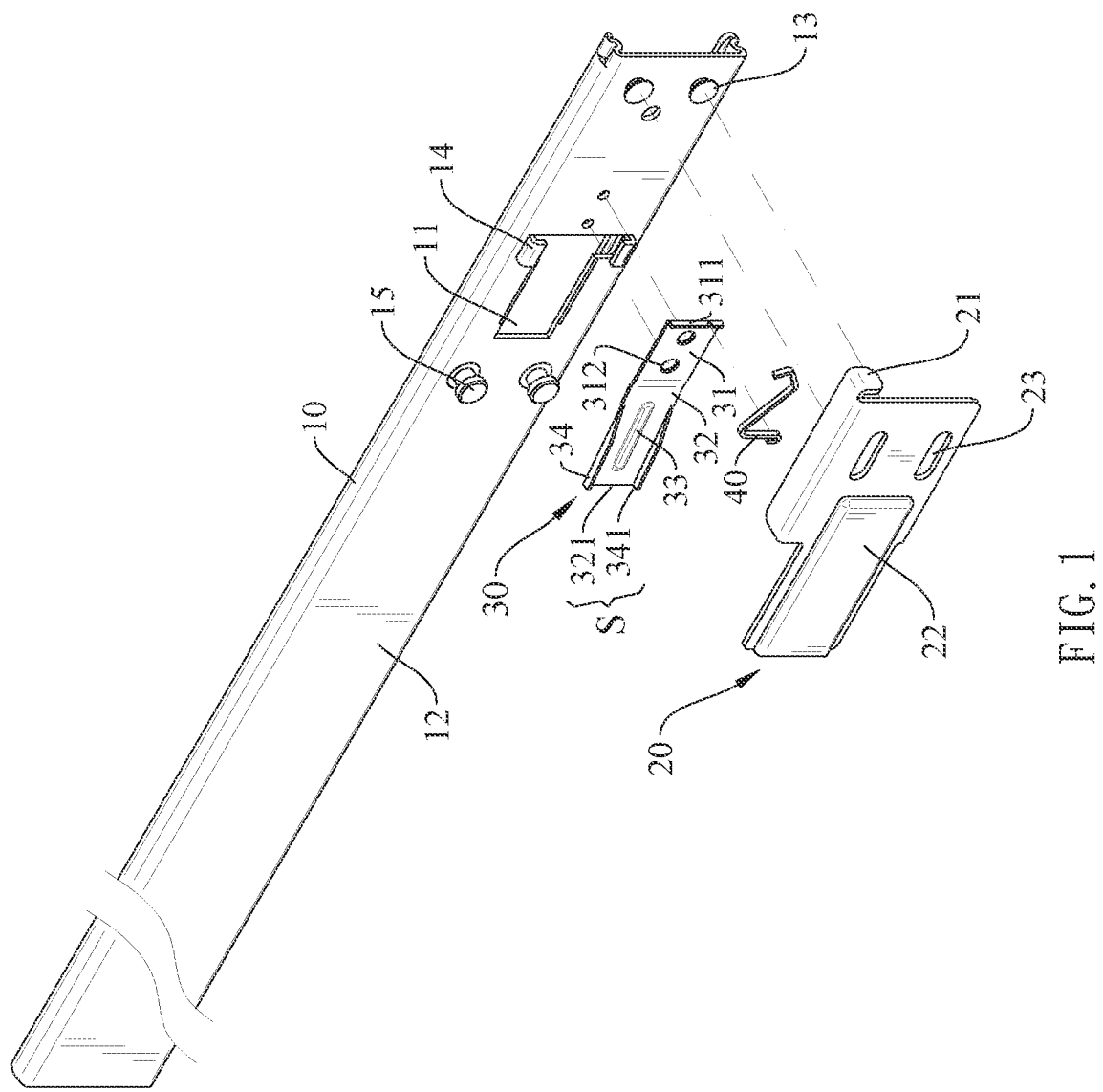
FIG. 1 is an exploded perspective view of the tool-free unlocking device of the present invention.
Figure 2:
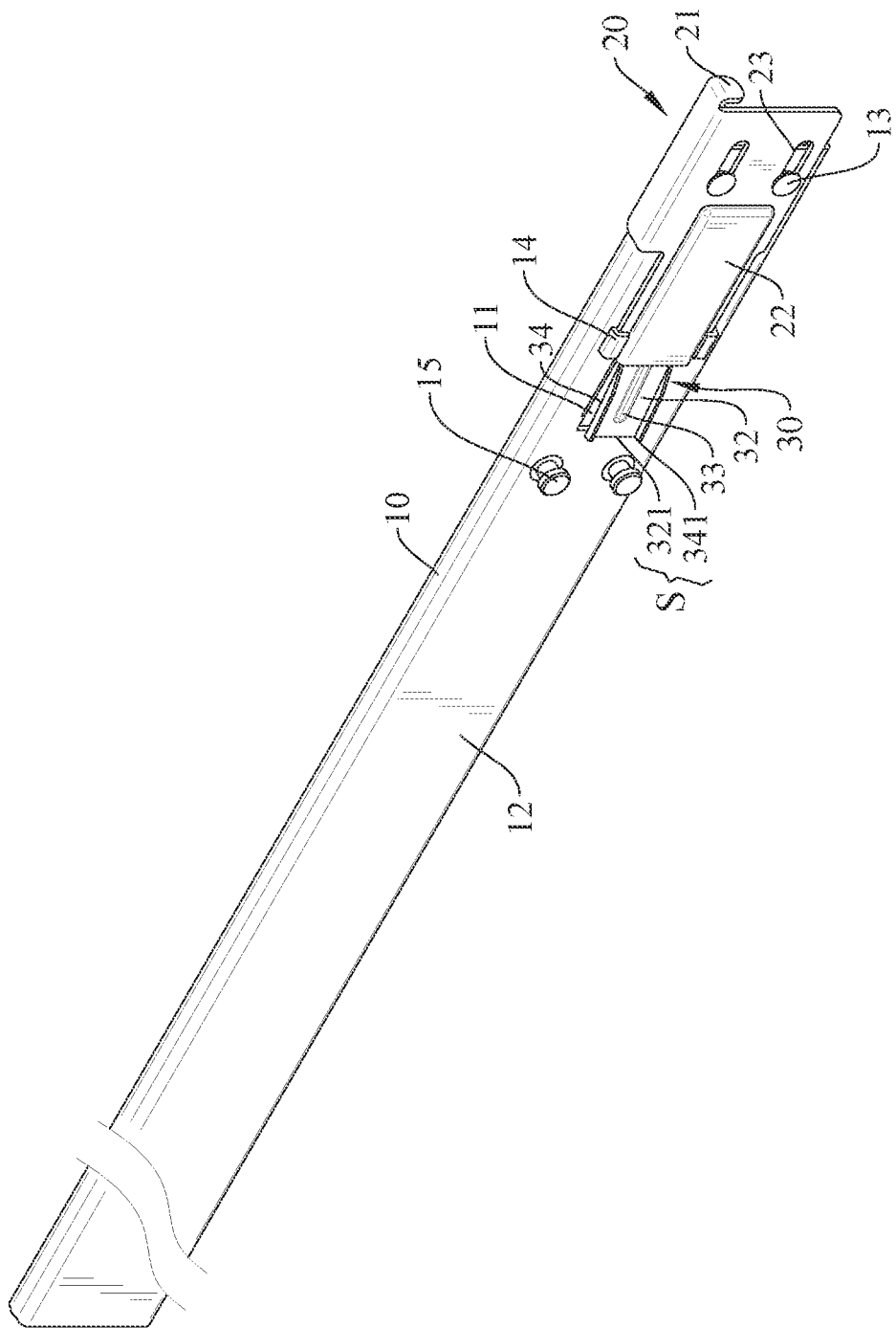
FIG. 2 is a combined perspective view of the tool-free unlocking device of the present invention.

As shown in FIG. 1 to FIG. 7B, the present invention is a tool-free unlocking device, comprising a frame 10, an unlatching member 20, and a locking member 30. The frame 10 is provided with an opening 11. The unlatching member 20 is movably connected to the frame 10. The locking member 30 has a first section 31 and a second section 32 extending from the first section 31. The first section 31 is fixed on the frame 10 and the second section 32 corresponds to the opening 11.

Based on the above, it may further comprise an elastic member 40. One end of the elastic member 40 is connected to the locking member 30, and the other end of the elastic member 40 is driven by the unlatching member 20 to operate. When the unlatching member 20 is not pushed, the elastic member 40 restores the unlatching member 20 to its original position with elasticity. In this embodiment, the elastic member 40 is in the form of a strip or a spring, and cooperates with a joint portion 311 at the front end of the first section 31 of the locking member 30. The joint portion 311 can provide the elastic member 40 for connection, but is not limited to this.

Please refer to FIG. 3, FIG. 4, FIG. 5 and FIG. 6 again. In this embodiment, the unlatching member 20 comprises a pushing portion 21 and a pushing groove 22. The pushing portion 21 can span the frame 10 and the pushing groove 22 corresponds to the surface 12 of the frame 10 so that the elastic member 40 can be accommodated in the pushing groove 22. When the pushing portion 21 is pushed, the pushing groove 22 can displace the elastic member 40. The frame 10 is provided with at least one limiting member 13, and the unlatching member 20 is provided with at least one limiting hole 23. The at least one limiting hole 23 can be displaced relative to the at least one limiting member 13. At the same time, the frame 10 is provided with at least one limiter 14, and the at least one limiter 14 can be hooked on the unlatching member 20, so the unlatching member 20 has high operational stability, but it is not limited to this.

Please refer to FIG. 7A and FIG. 7B again, which is the first embodiment of the locking member 30. The second section 32 of the locking member 30 is provided with at least one first rib 33. The at least one first rib 33 is located in front of the end surface 321 of the second section 32. The second section 32 of the locking member 30 is provided with at least one second rib 34. The end surface 341 of each second rib 34 and the end surface 321 of the second section 32 form an abutment surface S, but are not limited thereto. In addition, the second section 32 of the locking member 30 is provided with a mounting hole 312, and the mounting hole 312 can combine the locking member 30 with the frame 10 through rivets.

Please refer to FIG. 8A and FIG. 8B again, which is the second embodiment of the locking member 30A. The second section 32 of the locking member 30A is provided with at least one first rib 33. The at least one first rib 33 is located in front of the end surface 321 of the second section 32. The second section 32 of the locking member 30A is provided with at least one second rib 34. The end surface 341 of the at least one second rib 34 and the end surface 321 of the second section 32 form an abutment surface S, but are not limited thereto. In addition, the second section 32 of the locking member 30A is provided with a mounting hole 312, and the mounting hole 312 can combine the locking member 30A with the frame 10 through rivets.

Please refer to FIG. 9A and FIG. 9B again, which is the third embodiment of the locking member 30B. The first section 31 of the locking member 30B and the frame 10 are integrally formed. The second section 32 of the locking member 30B is provided with at least one second rib 34. The end surface 341 of the at least one second rib 34 and the end surface 321 of the second section 32 form an abutment surface S, but are not limited thereto.

Figure 10A:
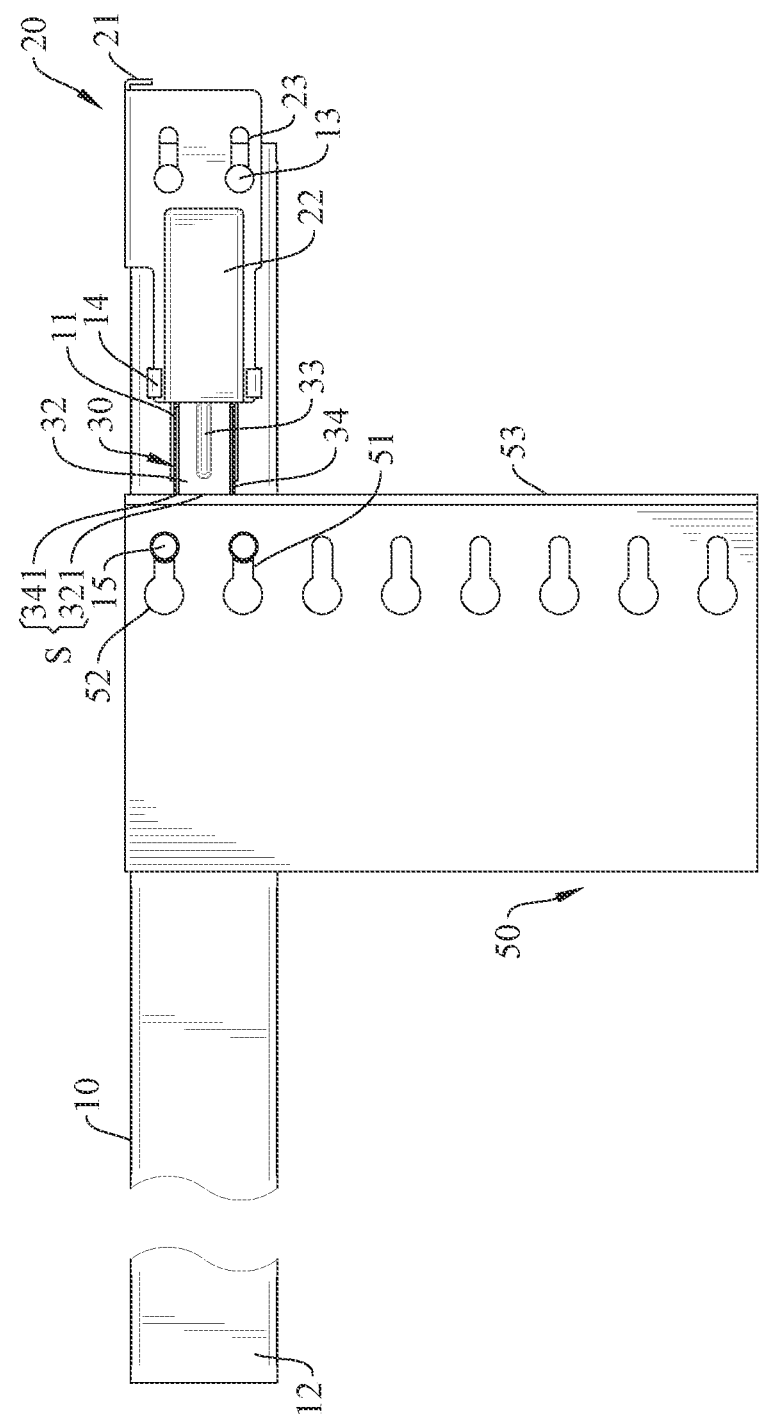
FIG. 10A is a front view of the tool-free unlocking device of the present invention locked to the machine column.
Figure 10B:
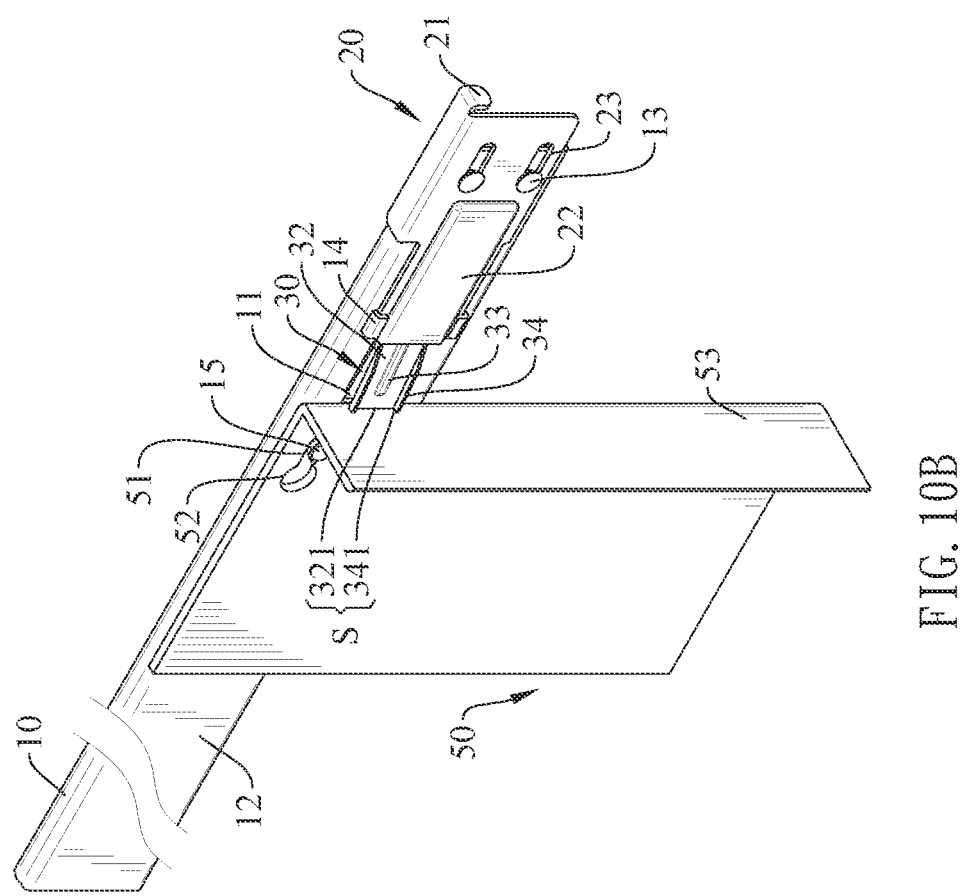
FIG. 10B is a three-dimensional view of the tool-free unlocking device of the present invention locked to the machine column.
Figure 11A:
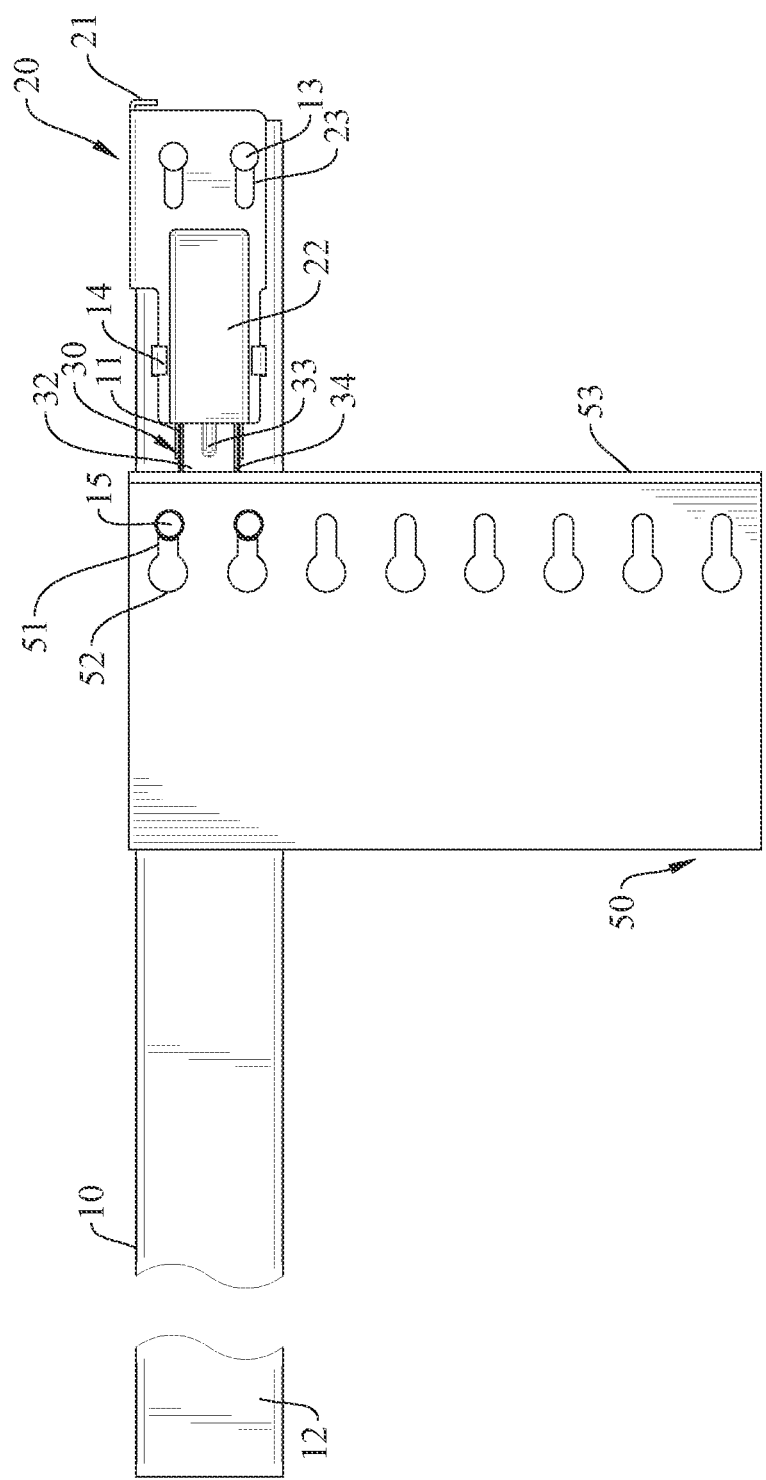
FIG. 11A is a front view of the tool-free unlocking device of the present invention unlocked on the machine column.
Figure 11B:
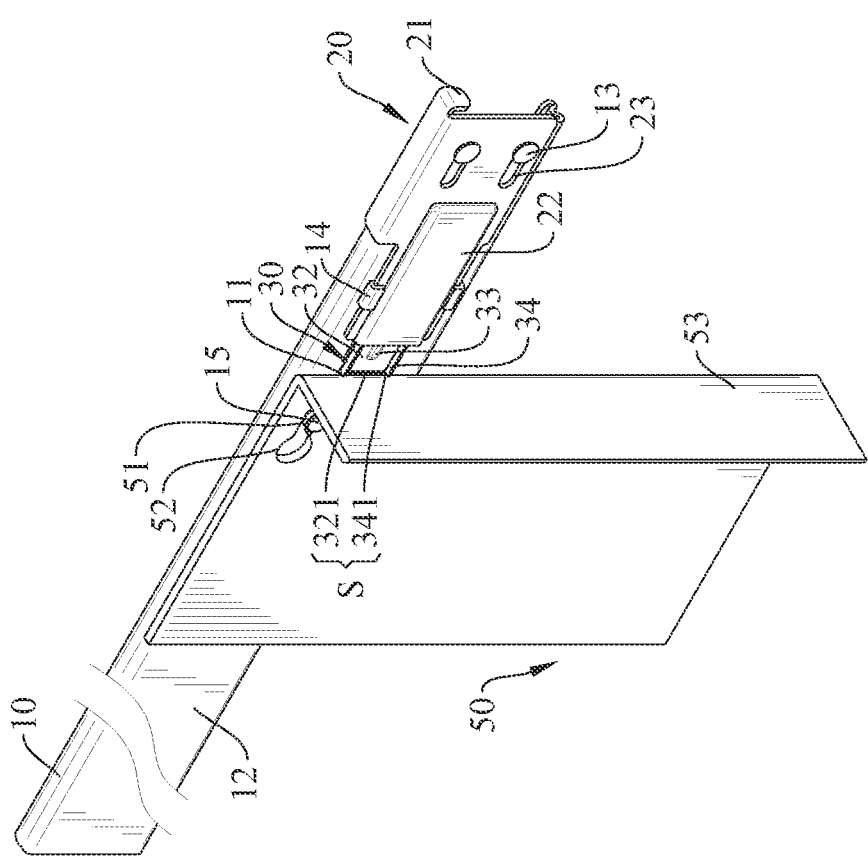
FIG. 11B is a three-dimensional view of the tool-free unlocking device of the present invention unlocked on the machine column.
Figure 12A:
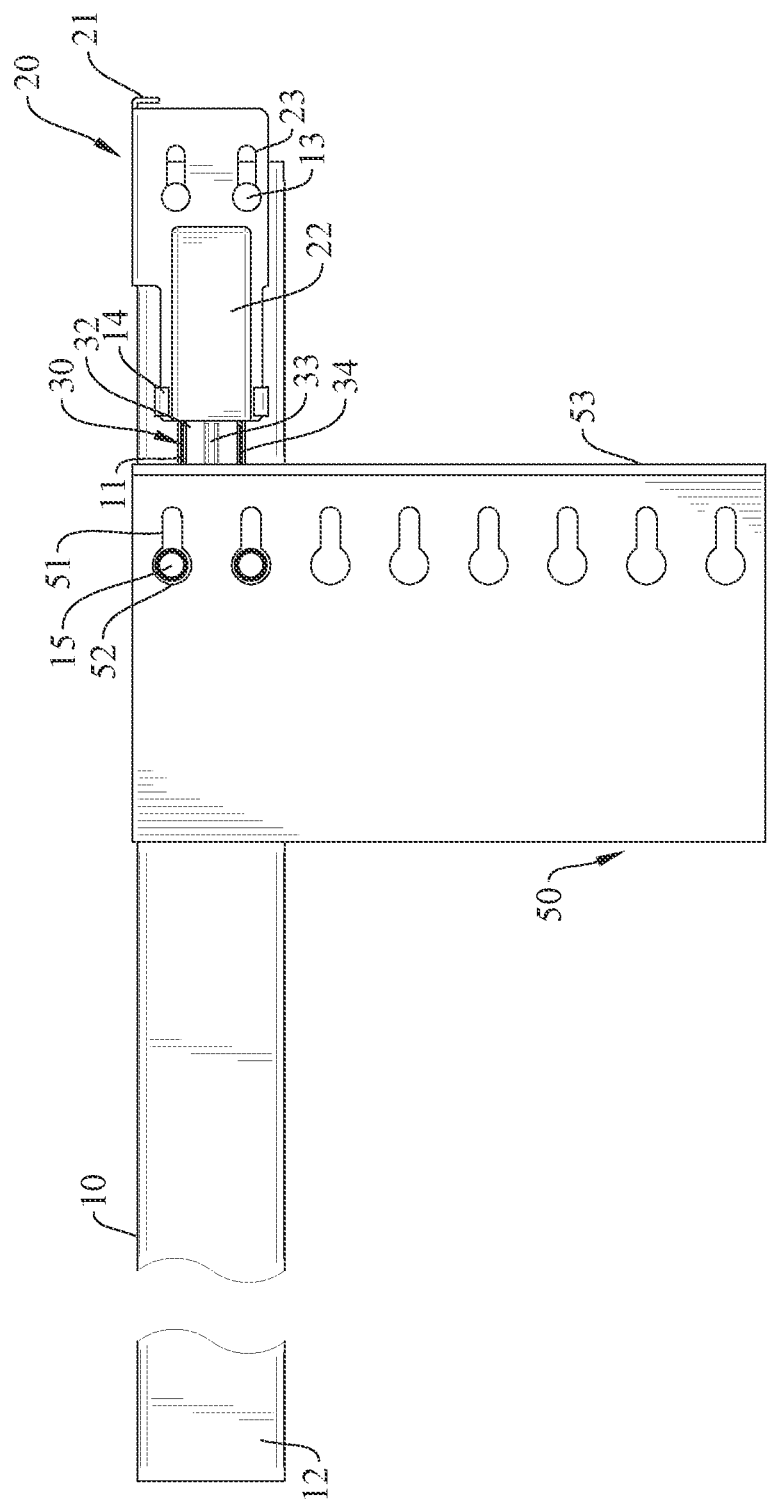
FIG. 12A is a front view of the frame of the present invention disassembled from the machine column.
Figure 12B:
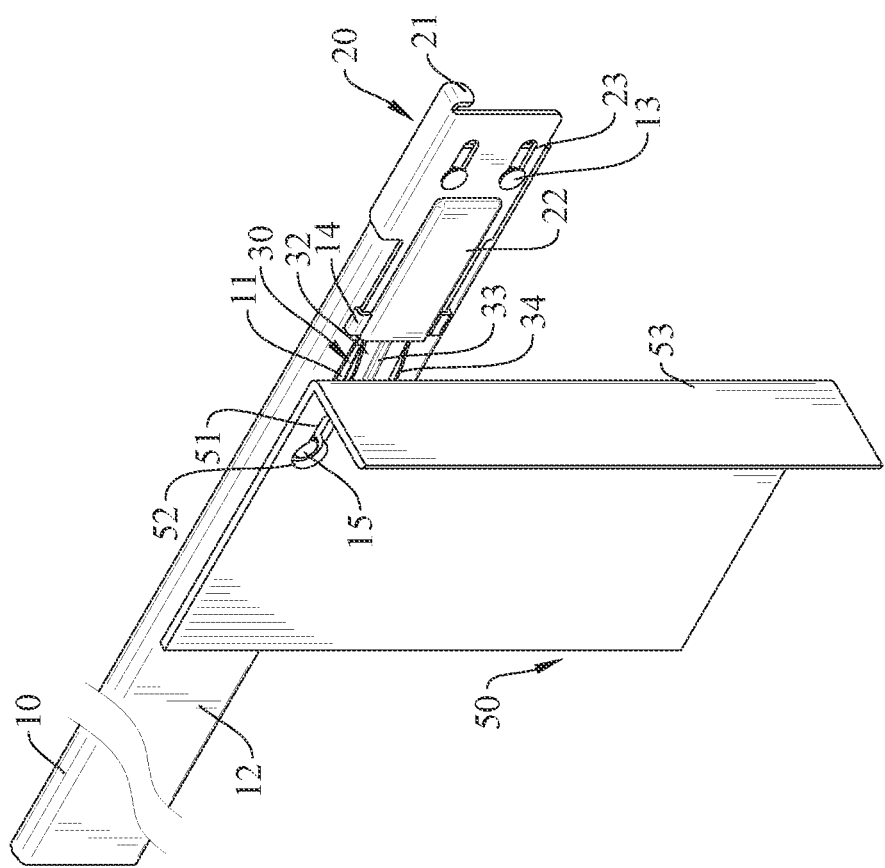
FIG. 12B is a three-dimensional view of the frame of the present invention disassembled from the machine column.

Based on this structure, the tool-free unlocking device can be used with a machine column 50. The machine column 50 is provided with at least one positioning hole 51 and a disassembly hole 52 connected to the positioning hole 51. The frame 10 is provided with at least one positioning member 15. The positioning member 15 can move to the positioning hole 51 to position the frame 10 or to the disassembly hole 52 to disassemble the frame 10. As shown in FIGS. 10A and 10B, when the unlatching member 20 is not pushed, the end surface 321 of the second section 32 of the locking member 30 abuts against the column surface 53 of the machine column 50 to form a locked state. As shown in FIG. 11A and FIG. 11B, when the unlatching member 20 is pushed from the first section 31 of the locking member 30 to the second section 32 of the locking member 30, the second section 32 of the locking member 30 will be pushed down into the opening 11 of the frame 10 and separated from the column surface 53 of the machine column 50 to form an unlocked state. As shown in FIGS. 12A and 12B, the frame 10 uses the positioning member 15 to move from the positioning hole 51 to the disassembly hole 52, so that the frame 10 is disassembled from the machine column 50.

To sum up, the technical means disclosed in the present invention indeed meet the requirements for invention patents such as "novelty", "progressivity" and "available for industrial utilization". We pray that the review committee will grant a patent to encourage invention.

However, the above disclosed drawings and descriptions are only preferred embodiments of the present invention. Modifications or equivalent changes made by those familiar with the art in accordance with the spirit and scope of this invention should still be included in the patent application scope of this invention.

What is claimed is:

1. A tool-free unlocking device, comprising:
   a frame provided with an opening;
   an unlatching member movably connected to said frame; and
   a locking member, said locking member comprising a first section and a second section extending from said first section, said second section comprising an end surface, said first section being fixed on said frame and said second section being positioned in alignment with and adjacent to said opening; and
   an elastic member, said elastic member having one end thereof connected to said locking member, and an opposite end thereof driven by said unlatching member to operate;
   wherein when said unlatching member is not pushed, said end surface of said second section of said locking member is not pushed down into said opening of said frame; when said unlatching member is pushed from said first section of said locking member to said second section of said locking member, said second section of said locking member is pushed down into said opening of said frame.

2. The tool-free unlocking device as claimed in claim 1, wherein said elastic member is strip-shaped.

3. The tool-free unlocking device as claimed in claim 1, wherein said unlatching member further comprises a pushing portion and a pushing groove, said pushing portion being able to span said frame and said pushing groove corresponding to the surface of said frame, so that said elastic member is capable to be accommodated in said pushing groove, and when said pushing portion is pushed, said pushing groove displaces said elastic member.

4. The tool-free unlocking device as claimed in claim 1, wherein said second section of said locking member is provided with at least one rib, and said at least one rib is located at a front side of said end surface of said second section.

5. The tool-free unlocking device as claimed in claim 1, wherein said second section of said locking member is provided with at least one rib, said at least one rib comprising an end surface, the end surface of said at least one rib and the end surface of said second section forming an abutment surface.

6. The tool-free unlocking device as claimed in claim 1, wherein said first section of said locking member is integral formed with said frame.

7. The tool-free unlocking device as claimed in claim 1, further comprising a machine column, said machine column comprising at least one positioning hole and at least one disassembly hole respectively connected to said at least one positioning hole and a column surface, wherein said frame is provided with at least one positioning member, and said at least one positioning member is able to move said at least one positioning hole, so that said end surface of said second section of said locking member abuts against said column surface of said machine column to form a locked state to position said frame or move to said at least one disassembly hole, so that said second section of said locking member will be pushed down into the opening of said frame and separated from said column surface of said machine column to form an unlocked state to disassemble said frame.

8. The tool-free unlocking device as claimed in claim 1, wherein said frame further comprises at least one limiting member, and said unlatching member comprises at least one limiting hole, said at least one limiting hole being capable to be displaced relative to said at least one limiting member.

9. The tool-free unlocking device as claimed in claim 1, wherein said frame further comprises at least one limiter, said limiter being able to be hooked into said unlatching member.

10. A tool-free unlocking device, comprising:
a frame provided with an opening;
an unlatching member movably connected to said frame; and
a locking member, said locking member comprising a first section and a second section extending from said first section, said second section comprising an end surface, said first section being fixed on said frame and said second section being positioned in alignment with and adjacent to said opening;
wherein when said unlatching member is not pushed, said end surface of said second section of said locking member is not pushed down into said opening of said frame; when said unlatching member is pushed from said first section of said locking member to said second section of said locking member, said second section of said locking member is pushed down into said opening of said frame;
wherein said frame further comprises at least one limiting member, and said unlatching member comprises at least one limiting hole, said at least one limiting hole being capable to be displaced relative to said at least one limiting member.

11. The tool-free unlocking device as claimed in claim 10, further comprising an elastic member, said elastic member having one end thereof connected to said locking member, and an opposite end thereof driven by said unlatching member to operate.

12. The tool-free unlocking device as claimed in claim 10, wherein said elastic member is strip-shaped.

13. The tool-free unlocking device as claimed in claim 10, wherein said unlatching member further comprises a pushing portion and a pushing groove, said pushing portion being able to span said frame and said pushing groove corresponding to the surface of said frame, so that said elastic member is capable to be accommodated in said pushing groove, and when said pushing portion is pushed, said pushing groove displaces said elastic member.

14. The tool-free unlocking device as claimed in claim 10, wherein said second section of said locking member is provided with at least one first rib, and said at least one first rib is located at a front side of said end surface of said second section.

15. The tool-free unlocking device as claimed in claim 10, wherein said second section of said locking member is provided with at least one second rib, said at least one second rib comprising an end surface, the end surface of said at least one second rib and the end surface of said second section forming an abutment surface.

16. A tool-free unlocking device, comprising:
a frame provided with an opening;
an unlatching member movably connected to said frame; and
a locking member, said locking member comprising a first section and a second section extending from said first section, said second section comprising an end surface, said first section being fixed on said frame and said second section being positioned in alignment with and adjacent to said opening;
wherein when said unlatching member is not pushed, said end surface of said second section of said locking member is not pushed down into said opening of said frame; when said unlatching member is pushed from said first section of said locking member to said second section of said locking member, said second section of said locking member is pushed down into said opening of said frame;
wherein said frame further comprises at least one limiter, said limiter being able to be hooked into said unlatching member.

17. The tool-free unlocking device as claimed in claim 16, further comprising an elastic member, said elastic member having one end thereof connected to said locking member, and an opposite end thereof driven by said unlatching member to operate.

18. The tool-free unlocking device as claimed in claim 17, wherein said elastic member is strip-shaped.

19. The tool-free unlocking device as claimed in claim 17, wherein said unlatching member further comprises a pushing portion and a pushing groove, said pushing portion being able to span said frame and said pushing groove corresponding to the surface of said frame, so that said elastic member is capable to be accommodated in said pushing groove, and when said pushing portion is pushed, said pushing groove displaces said elastic member.

20. The tool-free unlocking device as claimed in claim 16, wherein said second section of said locking member is provided with at least one first rib, and said at least one first rib is located at a front side of said end surface of said second section.

\* \* \* \* \*